(12) United States Patent
Ota

(10) Patent No.: US 8,915,690 B2
(45) Date of Patent: Dec. 23, 2014

(54) TRANSPORT SYSTEM AND TRANSPORT METHOD

(75) Inventor: Tatsuji Ota, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 611 days.

(21) Appl. No.: 13/283,628

(22) Filed: Oct. 28, 2011

(65) Prior Publication Data

US 2012/0275886 A1 Nov. 1, 2012

(30) Foreign Application Priority Data

Nov. 4, 2010 (JP) ................................. 2010-247552
Aug. 30, 2011 (JP) ................................. 2011-187119

(51) Int. Cl.
*B66C 19/00* (2006.01)
*H01L 21/677* (2006.01)

(52) U.S. Cl.
CPC ......... *H01L 21/67769* (2013.01); *Y10S 414/14* (2013.01); *H01L 21/67733* (2013.01); *H01L 21/67736* (2013.01)
USPC ........... 414/281; 414/275; 414/279; 414/589; 414/591; 414/807; 414/940

(58) Field of Classification Search
CPC ............................................... H01L 21/67733
USPC ........... 414/222.08, 275, 279, 281, 284, 589, 414/591, 626, 807, 940
See application file for complete search history.

(56) References Cited

U.S. PATENT DOCUMENTS

| | | | | |
|---|---|---|---|---|
| 4,049,132 A | * | 9/1977 | Stromback ................. | 414/141.3 |
| 5,395,199 A | * | 3/1995 | Day et al. ..................... | 414/267 |
| 6,889,813 B1 | * | 5/2005 | Trammell et al. .......... | 198/346.3 |
| 7,413,396 B2 | * | 8/2008 | Ito ................................. | 414/626 |
| 7,991,505 B2 | * | 8/2011 | Lert et al. ..................... | 700/214 |
| 8,047,762 B2 | * | 11/2011 | Zimmerhackl et al. ....... | 414/806 |
| 2006/0051192 A1 | * | 3/2006 | Fujiki .......................... | 414/626 |
| 2006/0182553 A1 | | 8/2006 | Yamamoto et al. | |

(Continued)

FOREIGN PATENT DOCUMENTS

| | | |
|---|---|---|
| EP | 1 707 507 A1 | 10/2006 |
| EP | 1 944 251 A1 | 7/2008 |

(Continued)

OTHER PUBLICATIONS

Ota et al., "Transport System and Transport Method," U.S. Appl. No. 13/283,630, filed Oct. 28, 2011.

(Continued)

*Primary Examiner* — Scott Lowe

(74) *Attorney, Agent, or Firm* — Keating & Bennett, LLP

(57) ABSTRACT

A transport system includes a first track that passes above loading ports of the processing devices, and an overhead travelling vehicle that travels along the first track and includes a hoist. A second track is below the first track, passes above the loading ports, and is disposed in parallel or substantially in parallel with the first track. A buffer is provided below the second track at a position higher than the loading ports, and is arranged such that the articles can pass in a vertical direction over the loading ports. The buffer is disposed such that the articles can pass through the height position of the buffer in a vertical direction over the loading ports. A local vehicle travels along the second track and includes a hoist to perform delivery and receipt of the articles between the buffer and the loading ports.

13 Claims, 6 Drawing Sheets

(56) References Cited

U.S. PATENT DOCUMENTS

| | | |
|---|---|---|
| 2008/0221728 A1 | 9/2008 | Inui |
| 2010/0239400 A1 | 9/2010 | Ishikawa |
| 2012/0114453 A1* | 5/2012 | Ota et al. .................... 414/281 |

FOREIGN PATENT DOCUMENTS

| | | |
|---|---|---|
| JP | 2005-150129 A | 6/2005 |
| JP | 2006-224944 A | 8/2006 |
| JP | 2008-100835 A | 5/2008 |
| JP | 2010-064833 A | 3/2010 |
| JP | 2011-207621 A | 10/2011 |
| WO | 00/37338 A1 | 6/2000 |
| WO | 2011/111283 A1 | 9/2011 |

OTHER PUBLICATIONS

Official Communication issued in corresponding European Patent Application No. 11187030.9, mailed on Feb. 23, 2012.
Ota et al.; "Conveying System and Conveying Method"; U.S. Appl. No. 13/877,889, filed Apr. 4, 2013.

* cited by examiner

F I G. 1
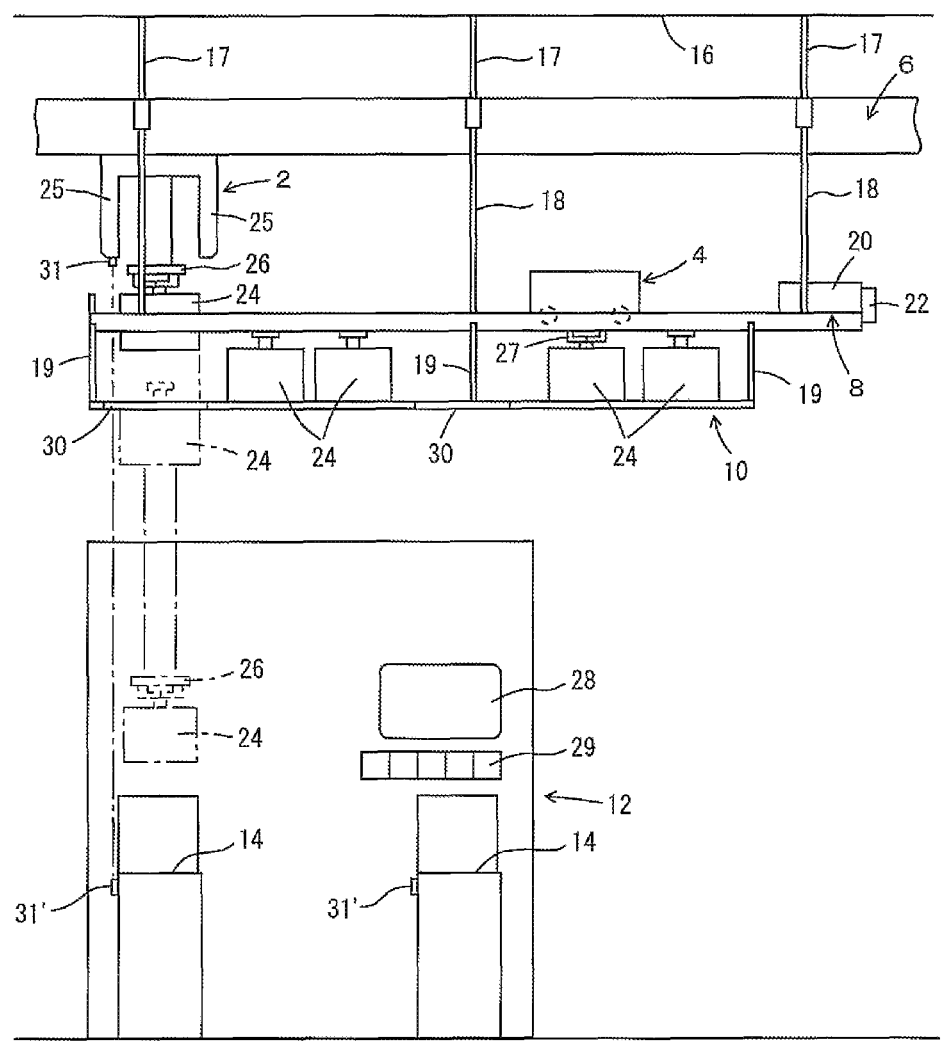

F I G. 2
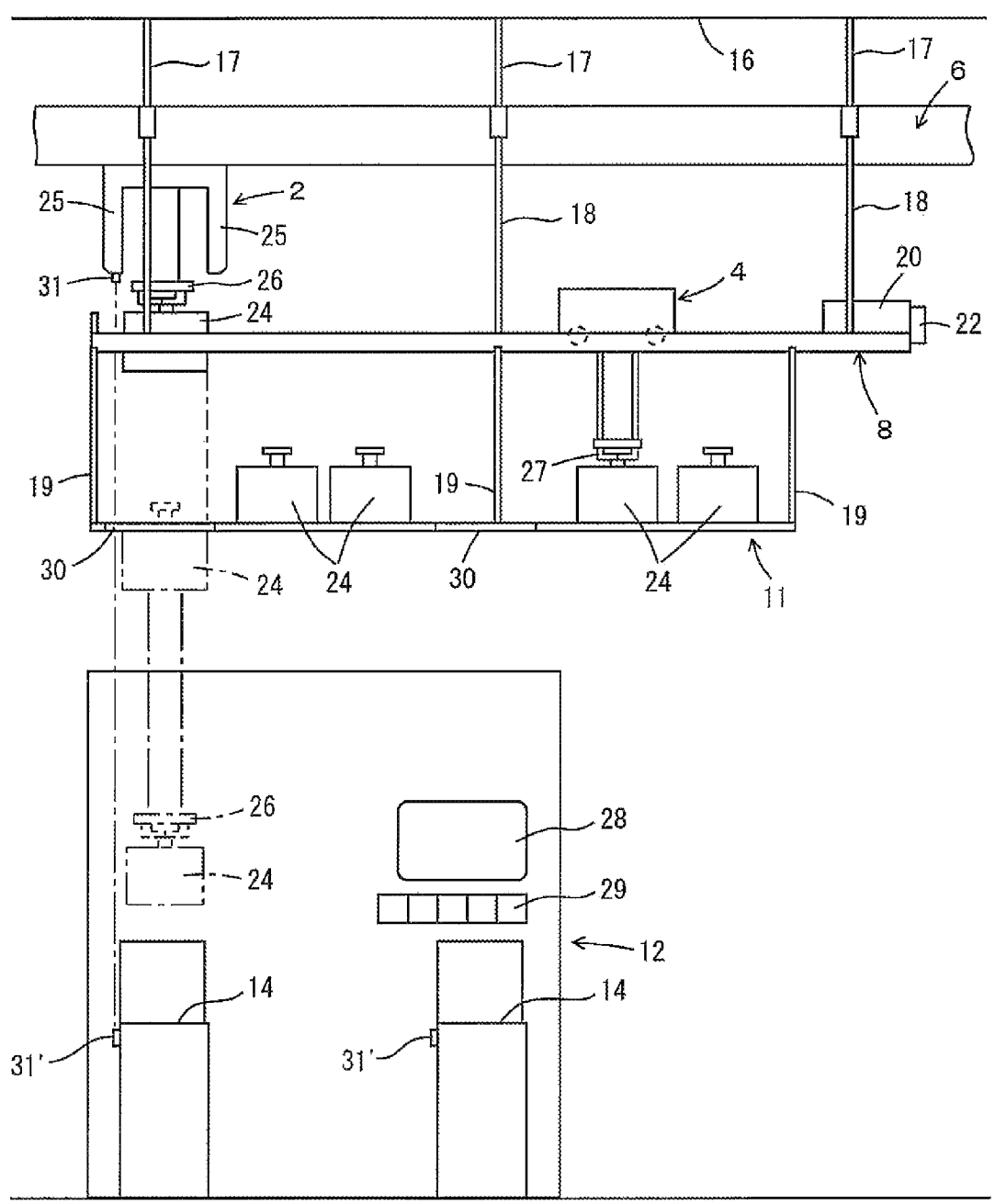

TRANSPORT SYSTEM AND TRANSPORT METHOD

BACKGROUND OF THE INVENTION

1. Field of the Invention

The present invention relates to a transport system, and in particular to a transport system that supplies and removes articles without causing a processing device to wait.

2. Description of the Related Art

There is need for articles such as FOUPs (sealed cassettes for transporting semiconductor wafers) to be supplied to and removed from the loading ports of devices such as a semiconductor machining device and a semiconductor inspection device without causing such devices to wait. For this reason, it has been proposed to provide a buffer in the vicinity of a processing device, and provide a second transport device for performing transport between the buffer and the processing device. For example, in JP 2006-224944A, multiple overhead travelling vehicle tracks are disposed in parallel in a ceiling space, one of which is used for long-distance transport, and another of which is used for short-distance transport. A buffer is disposed under the track for long-distance transport, and the loading port of a processing device is disposed under the track for short-distance transport. The overhead travelling vehicle for long-distance transport performs the delivery and receipt of articles with the buffer, and the overhead travelling vehicle for short-distance transport performs the delivery and receipt of articles between the buffer and the loading port. Accordingly, if articles required by the processing device have been transported to the buffer in advance, the articles can be quickly supplied to the processing device. Also, the overhead travelling vehicle for short-distance transport quickly removes articles from the loading port of the processing device. However, this configuration requires providing tracks at the same height position in parallel, thus increasing the floor space occupied by the transport system in a plan view.

In JP 2005-150129A, a buffer including a transport device is provided in front of a processing device, an overhead travelling vehicle performs the delivery and receipt of articles with the buffer, and the transport device of the buffer performs the delivery and receipt of articles with the loading port. However, a display for indicating the operation state, an operation panel for manual operation, and the like are provided on the front surface of the processing device, and it is not preferable for them to be blocked by the buffer. Also, the loading port is used not only by an automatic transport device, but also for manual supply and removal of articles, and manual access is difficult if the front surface of the processing device is covered by the buffer.

SUMMARY OF THE INVENTION

Preferred embodiments of the present invention provide a transport system and method that swiftly supply articles to and remove articles from a processing device without blocking the front surface of the processing device, while significantly reducing the amount of floor space occupied by the transport system in a plan view.

Another preferred embodiment of the present invention provides a specific configuration of a local vehicle.

Also, various preferred embodiments of the present invention eliminate the need for a local vehicle feeding line.

In addition, preferred embodiments of the present invention detect the existence of a local vehicle under an overhead travelling vehicle without an additional device.

A transport system according to a preferred embodiment of the present invention transports an article between a plurality of processing devices, and includes a first track that passes above a loading port of a processing device; an overhead travelling vehicle that travels along the first track and includes a hoist; a second track that is below the first track, passes above the loading port, and is disposed in parallel or substantially in parallel with the first track; a buffer for placement of the article, the buffer being provided below the second track at a position higher than the loading port, and being arranged such that the article can pass in a vertical direction over the loading port; and a local vehicle that travels along the second track and includes a hoist to perform delivery and receipt of the article between the buffer and the loading port.

According to this preferred embodiment of the present invention, the space where the overhead travelling vehicle travels and the space where the local vehicle travels can be vertically overlapped with each other. This enables a significant reduction in the amount of floor space occupied by the transport system in a plan view. Also, the front surface of the processing device is not blocked by the buffer. Furthermore, the overhead travelling vehicle and the local vehicle can both perform the delivery and receipt of articles with the buffer and the loading port in both directions. Accordingly, the processing device is not caused to wait, and articles can be swiftly transported from the processing device. The buffer may be provided at only positions that are not over the loading port, or a frame or the like of the buffer may be disposed over the loading port as well.

Another preferred embodiment of the present invention provides a transport system for addition on to an existing overhead travelling vehicle system including an overhead travelling vehicle in which a hoist is included and an overhead travelling vehicle track that passes above a loading port of a processing device. The transport system includes a second track that is below the overhead travelling vehicle track, passes above the loading port of the processing device, and is disposed in parallel or substantially in parallel with the overhead travelling vehicle track; a buffer for placement of an article, the buffer being provided below the second track at a position higher than the loading port, and being arranged such that an article can pass in a vertical direction over the loading port; and a local vehicle that travels along the second track and includes a hoist to perform delivery and receipt of the article between the buffer and the loading port.

This configuration enables the transport system including the second track, the local vehicle, and the buffer to be added on to an existing overhead travelling vehicle system. Also, the add-on transport system does not require processing device modification, and even when applied to an existing overhead travelling vehicle system, the add-on transport system only requires modification for the shared use of struts.

In various preferred embodiments of the present invention, delivery and receipt of an article is performed between an overhead travelling vehicle in which a hoist is provided and a loading port of a processing device.

The overhead travelling vehicle travels along an overhead travelling vehicle track that passes above the loading port of the processing device, a second track is provided that is below the overhead travelling vehicle track, passes above the loading port of the processing device, and is disposed in parallel or substantially in parallel with the overhead travelling vehicle track, a buffer for placement of the article is provided below the second track at a position higher than the loading port, and is arranged such that the article can pass in a vertical direction over the loading port, a local vehicle is arranged such that the local vehicle travels along the second track and includes a hoist to perform delivery and receipt of the article between the buffer and the loading port, the overhead travelling vehicle performs a step for performing delivery and receipt of the article with the buffer using the hoist; and the local vehicle performs a step for performing delivery and receipt of the article between the buffer and the loading port.

Preferably, in the transport system according to a preferred embodiment of the present invention, the second track includes at least a pair of rails, and a gap through which the article can pass in the vertical direction is provided between the pair of rails. According to this aspect of the present preferred embodiment of the present invention, the article can pass through the second track in the vertical direction since, for example, the gap between the pair of rails of the second track for supporting the local vehicle is preferably greater than the depth of the articles. Accordingly, the first track, the second track, and the loading port can be disposed so as to vertically overlap each other, and the article can be delivered and received easily. Also, the local vehicle can be supported by the pair of rails.

More preferably, in the transport system according to a preferred embodiment of the present invention, the first track, the second track, and the buffer are disposed in front of the processing device so as to overlap with each other in parallel or substantially in parallel in plan view, and the buffer is provided with a gap above the loading port, and the overhead travelling vehicle and the local vehicle can perform delivery and receipt of the article with the loading port via the gap in the buffer. This enables both the overhead travelling vehicle and the local vehicle to access the loading port.

Particularly preferably, in the transport system according to a preferred embodiment of the present invention, the buffer is disposed at a height according to which the local vehicle can pass above the buffer on which an article is placed in a case where the local vehicle is transporting an article. This enables the overhead travelling vehicle and the local vehicle to drop off an article at an arbitrary free space on the buffer, and remove an article from an arbitrary position.

Alternatively, the buffer may be disposed at a height according to which the local vehicle can pass above the buffer on which an article is placed in a case where the local vehicle is not transporting an article, and the local vehicle cannot pass above the buffer on which an article is placed in a case where the local vehicle is transporting an article. This configuration has the constraint of a sequence arising in the delivery of articles to and removal of articles from the buffer by the local vehicle, but reduces the height difference between the buffer and the second track, thus facilitating the installation of the buffer.

For example, a controller that is arranged and programmed to control the overhead travelling vehicle and the local vehicle may be provided, and control may be performed such that the overhead travelling vehicle delivers an article to the buffer and removes an article from the loading port, and the local vehicle delivers the article from the buffer to the loading port. According to this configuration, from the viewpoint of the overhead travelling vehicle, the buffer becomes a loading port exclusively for the delivery of articles, and the loading port of the processing device becomes a loading port exclusively for the removal of articles, thus allowing prevention and minimization of the occurrence of the problem of not being able to deliver an article to a loading port. Also, from the viewpoint of the processing device, articles that are to be processed can be accumulated on the buffer.

Preferably, the local vehicle is driven by a power storage member, and a charging device that charges the power storage member in the local vehicle is provided at a position along the second track that is located away from a position over the loading port and away from a position over the buffer. The power storage member may be a secondary buttery or a capacitor. This configuration enables charging of the battery of the local vehicle without hindering the delivery of articles to and the removal of articles from the loading port and the buffer.

Alternatively, preferably the local vehicle is driven by electrical power from the power storage member, and a charging device that charges the power storage member in the local vehicle is provided at each stop position of the local vehicle along the second track. Since the local vehicle can be charged each time it stops, the local vehicle can be driven by a battery or a capacitor such as an electric double layer capacitor, for example, and the capacity never has insufficient charge.

Preferably, the overhead travelling vehicle includes an optical communication member that is at a position over the loading port and performs optical communication with the loading port by light that has a vertically-oriented optical axis and passes through a travelling path of the local vehicle. According to this configuration, when the local vehicle is positioned over the loading port, the overhead travelling vehicle cannot perform optical communication with the loading port. Accordingly, optical communication with the loading port can be used to eliminate the possibility of the local vehicle interfering with the movement of articles between the overhead travelling vehicle and the loading port.

Also, a controller of the local vehicle may be provided so as to be able to communicate with the overhead travelling vehicle, the local vehicle, and the processing device. For example, the controller of the local vehicle communicates with the overhead travelling vehicle via optical or radio communication, and communicates with the local vehicle and the processing device via optical, radio, or wired communication. This allows the controller of the local vehicle to control the delivery of articles to and the removal of articles from the buffer and the loading port.

Preferably, in the transport system, the buffer is provided with a look-down sensor to detect an interfering object on the loading port side. Here, the "loading port side" refers to the vicinity or the neighborhood of the loading port. Also, if the local vehicle and the overhead travelling vehicle are controlled via the controller using the signal from this sensor, it is possible to prevent an interfering object such as a person in the vicinity of the loading port from interfering with the operations of the transport devices, namely the local vehicle and the overhead travelling vehicle.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a side view of relevant portions of a transport system according to a preferred embodiment of the present invention.

FIG. 2 is a side view of relevant portions of a transport system according to a variation of a preferred embodiment of the present invention in which the height level of a buffer has been changed from FIG. 1.

DETAILED DESCRIPTION OF THE PREFERRED EMBODIMENTS

Figure 3:
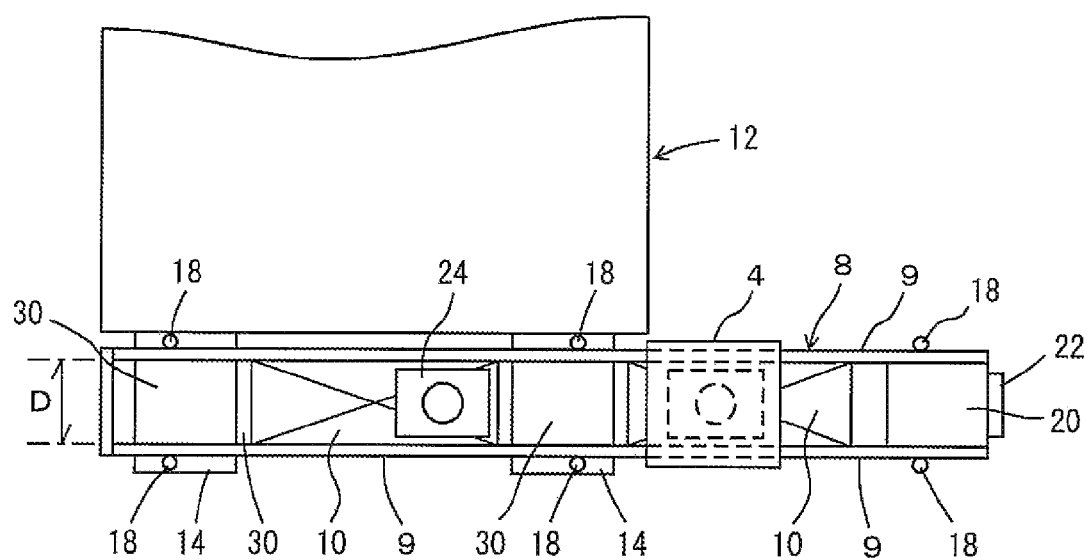
FIG. 3 is a plan view of relevant portions of the transport system according to a preferred embodiment of the present invention.

The following describes preferred embodiments of the present invention. The scope of the present invention is based on the claims, and is intended to be determined in accordance with the understanding of a person skilled in the art with reference to the description of preferred embodiments of the present invention and related art in the field of the present invention.

FIGS. 1 to 7 show a transport system according to preferred embodiments and variations thereof. In FIGS. 1 to 5, reference numeral 2 denotes an overhead travelling vehicle that performs inter bay transport and intra bay transport in a semiconductor factory, for example. Reference numeral 4 denotes a local vehicle that supplies articles 24 such as FOUPs to and removes the articles 24 from individual processing devices 12, or supplies articles to and removes articles from several adjacent processing devices 12. Reference numeral 6 denotes an overhead travelling vehicle track that preferably includes travelling rails and an electricity feeding rail. Reference numeral 8 denotes a track for the local vehicle 4 that includes a pair of rails 9 shown in FIG. 3, for example, and the articles 24 can vertically pass through the gap between the rails 9. Although the local vehicle 4 is shown as traveling above the track 8, the local vehicle 4 may travel below the track 8. The processing devices 12 each include one or more loading ports 14, and a buffer 10 and the tracks 6 and 8 extend in parallel or substantially in parallel in front of the processing devices 12. Reference numeral 16 denotes the ceiling of a clean room or the like, and the tracks 6 and 8 and the buffer 10 are supported by struts 17 to 19.

Reference numeral 10 denotes a buffer that is disposed below the track 8 in parallel or substantially in parallel with the tracks 6 and 8, and the buffer 10 is for the temporary placement of the articles 24. In the case where an article 24 has been temporarily placed on the buffer 10, the local vehicle 4 travelling along the track 8 can pass over the buffer 10 if it is not transporting an article 24, and cannot pass over the buffer 10 if it is transporting an article 24. For this reason, if many articles have been temporarily placed on a buffer 10, a transport sequence arises when the local vehicle 4 transports articles 24 on the buffer 10. In response to this, a configuration is possible in which, as shown in FIG. 2, the height level of the buffer 10 is lowered so as to become a buffer 11, thus enabling the local vehicle 4 transporting an article 24 to pass over the buffer 11 on which an article 24 has been temporarily placed. For example, a gap that is greater than or equal to two times the height of the article 24 is preferably provided between the bottom of the track 8 and the top of the buffer 11. This enables the overhead travelling vehicle 2 and the local vehicle 4 to drop off an article 24 at an arbitrary free position on the buffer 11, and remove an article 24 from an arbitrary position. The buffer 11 is preferably the same as the buffer 10 with the exception of having a lower height level, and either the buffer 10 or the buffer 11 may be used in the present preferred embodiment.

The overhead travelling vehicle track 6 is at the highest position, the local vehicle track 8 is disposed under the track 6, for example, and the tracks 6 and 8 vertically overlap each other in parallel or substantially in parallel. The buffer 10 or 11 is disposed under the tracks 6 and 8 in parallel or substantially in parallel with them, and the loading ports 14 are disposed under the tracks 6 and 8. In the case where the buffer 10 or 11 and the loading ports 14 are disposed so as to overlap each other in a plan view as in the present preferred embodiment, gaps 30 are provided in the buffer 10 and 11 over the loading ports in order for the articles 24 to vertically pass through. Alternatively, the buffer 10 or 11 may be arranged to avoid a position that overlaps the loading ports 14 in a plan view. The local vehicle track 8 includes a charging device 20 at, for example, a position that overlaps neither the loading ports 14 nor the buffer 10 or 11 in a plan view at one end of the track 8, and the charging device 20 charges the battery of the local vehicle 4. Note that the charging device 20 may be provided at a position that vertically overlaps an article 24 on the buffer 10 or 11. However, this configuration results in interference between the charging of the local vehicle 4 and the delivery and receipt of articles between the overhead travelling vehicle 2 and the buffer 10 or 11. Accordingly, it is preferable that the charging device 20 is provided at an end portion of the track 8, at a position that vertically overlaps neither the loading ports 14 nor the buffer 10 or 11.

Reference numeral 22 denotes a local controller that controls the local vehicle 4, and in the present preferred embodiment, the local controller 22 is provided in the vicinity of the charging device 20 and communicates with the local vehicle 4 by optical communication or the like. Note that the local controller 22 may be provided ground-side. Also, electricity is preferably supplied to the charging device 20 via a feeding line (not shown) provided along a strut 18, for example.

The overhead travelling vehicle 2 preferably includes safety covers 25 in the front and rear, for example, to prevent an article from falling, and moves an article 24 in the vertical direction by raising and lowering an elevation platform 26 using a hoist (not shown). The overhead travelling vehicle 2 may be additionally provided with, for example, a transverse feeding mechanism to transversely feed the articles 24. The overhead travelling vehicle preferably includes an optical communication unit 31, and interlocking before article delivery/receipt is performed by optical communication between the optical communication unit 31 and an optical communication unit 31' provided on the loading port 14 side, using light that has a vertically-oriented optical axis and passes through the travelling path of the local vehicle 4. Here, the optical communication units 31 and 31' are disposed such that the optical axis between the optical communication units 31 and 31' is blocked if the local vehicle 4 is positioned between the overhead travelling vehicle 2 and the loading port 14. This enables confirmation that the local vehicle is not positioned between the overhead travelling vehicle 2 and the loading port 14, without an extra device need to detect the local vehicle 4. Furthermore, the overhead travelling vehicle 2 is preferably provided with a communication device (not shown) that communicates with the local controller 22, and communicates with the local controller 22 when delivering articles to and receiving articles from the buffer 10 or 11.

Here, in addition to a machining device, it is assumed that an inspection device is included as a processing device 12. The loading port 14 is provided on the front surface of the processing device 12, and the articles 24 are delivered to and received from the loading port 14 by the overhead travelling vehicle 2, the local vehicle 4, and a person moving on the ground. In addition to the loading port 14, the front surface of the processing device 12 is provided with a display 28, an operation panel 29, and the like, thus enabling monitoring of the operation state of the processing device 12 and manually controlling the processing device 12.

The local vehicle track 8 preferably includes the pair of rails 9, and the width D (FIG. 3) between the rails 9 is greater than the depth of the articles 24, thus enabling the articles 24 to vertically pass through the gap between the rails 9 along with the elevation platform 26. Furthermore, the gap 30 is preferably provided in the buffer 10 or 11 above each of the loading ports 14, thus enabling the articles 24 to vertically pass through the buffer 10 or 11. Alternatively, the buffer 10 or 11 may be arranged so as to not be located over the loading ports 14. For such reasons, even if the tracks 6 and 8 and the loading ports 14 are disposed so as to vertically overlap each other, the overhead travelling vehicle 2 can deliver articles to and receive articles from the loading ports 14 and the buffer 10 or 11. Similarly, the local vehicle 4 can deliver articles to and receive articles from the buffer 10 or 11 and the loading ports 14. This enables minimizing of the floor space occupied by the transport system in a plan view.

Figure 4:
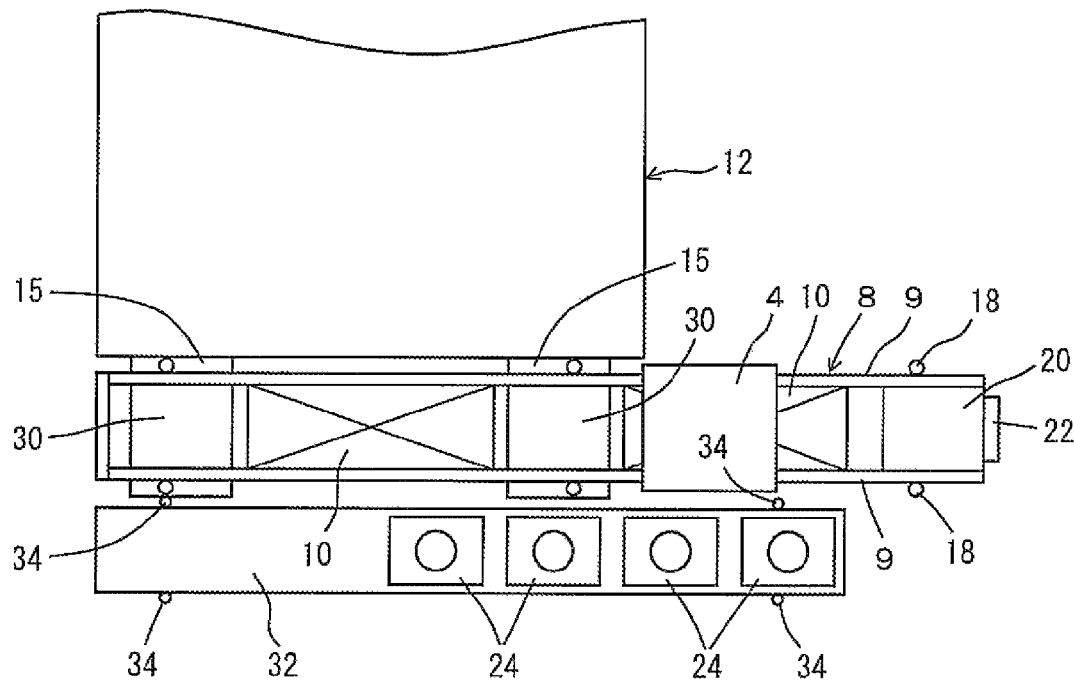
FIG. 4 is a plan view of relevant portions of the transport system according to a variation of a preferred embodiment of the present invention.

If the buffer capacity is insufficient with only the buffer 10 or the like under the local vehicle track 8, an additional buffer 32 may be provided and supported from the ceiling or the like by struts 34, as shown in FIG. 4. In this case, the additional buffer 32 is disposed at the same height position as the buffer 10 or the like, and the overhead travelling vehicle 2 and the local vehicle 4 are provided with, for example, a mechanism that transversely feeds the hoist.

Figure 5:
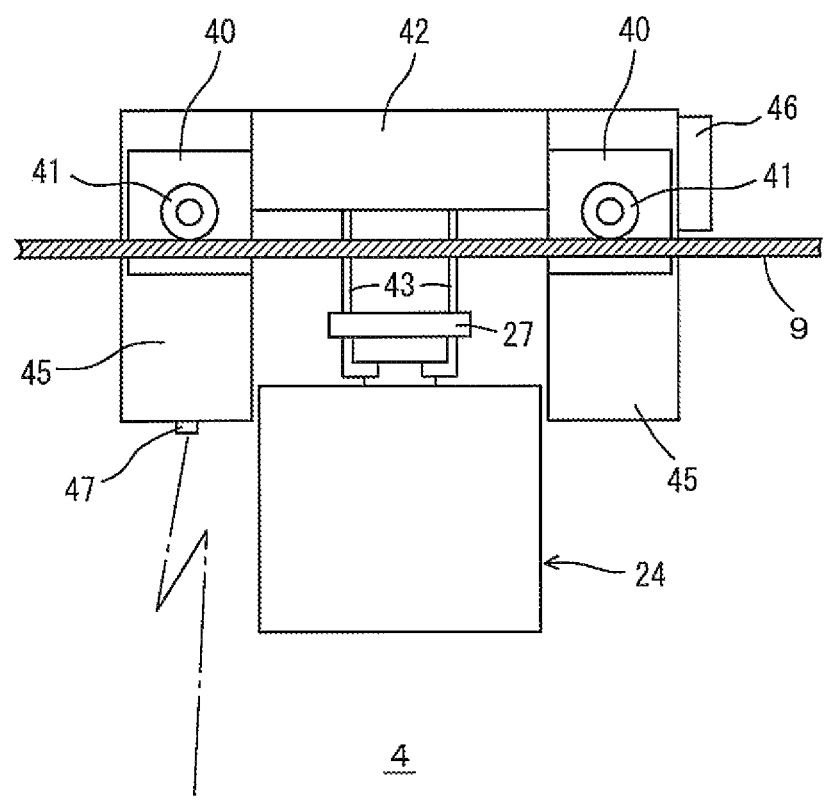
FIG. 5 is a side view of a local vehicle.

FIG. 5 shows the structure of the local vehicle 4, and the local vehicle 4 travels above the rails 9 via running wheels 41 or the like due to driving of a running motor denoted by reference numeral 40. Reference numeral 42 denotes a hoist that raises and lowers the article 24 supported by the elevation platform 27, by winding up and reeling out suspending members 43. Reference numeral 45 denotes a battery, reference numeral 46 denotes a connector, and the battery 45 is charged by the charging device 20. Reference numeral 47 denotes an optical communication unit that performs communication to interlock with the optical communication unit 31' of the loading port 14, similarly the optical communication unit 31 of the overhead travelling vehicle 2. Note that a configuration is possible in which the optical communication unit 47 is not provided, and interlocking with the loading port 14 is performed via the local controller 22. The local vehicle 4 is a simple vehicle that has a short travelling distance, does not include a mechanism for transverse feeding of articles or the like, and does not include an information processor for selecting a travelling route, avoiding interference with another vehicle, and the like. For example, one local vehicle 4 is caused to move back and forth between the front of the processing device 12 and a position somewhat spaced away from the front by travelling along the track 8, under control of the local controller 22. Also, the local vehicle 4 does not require additional floor space since it travels along the track 8 under the overhead travelling vehicle track 6. Also, the articles 24 can be delivered and received by vertically passing through the track 8 since the gap D between the rails 9 of the track 8 is greater than the depth of the articles 24.

Figure 6:
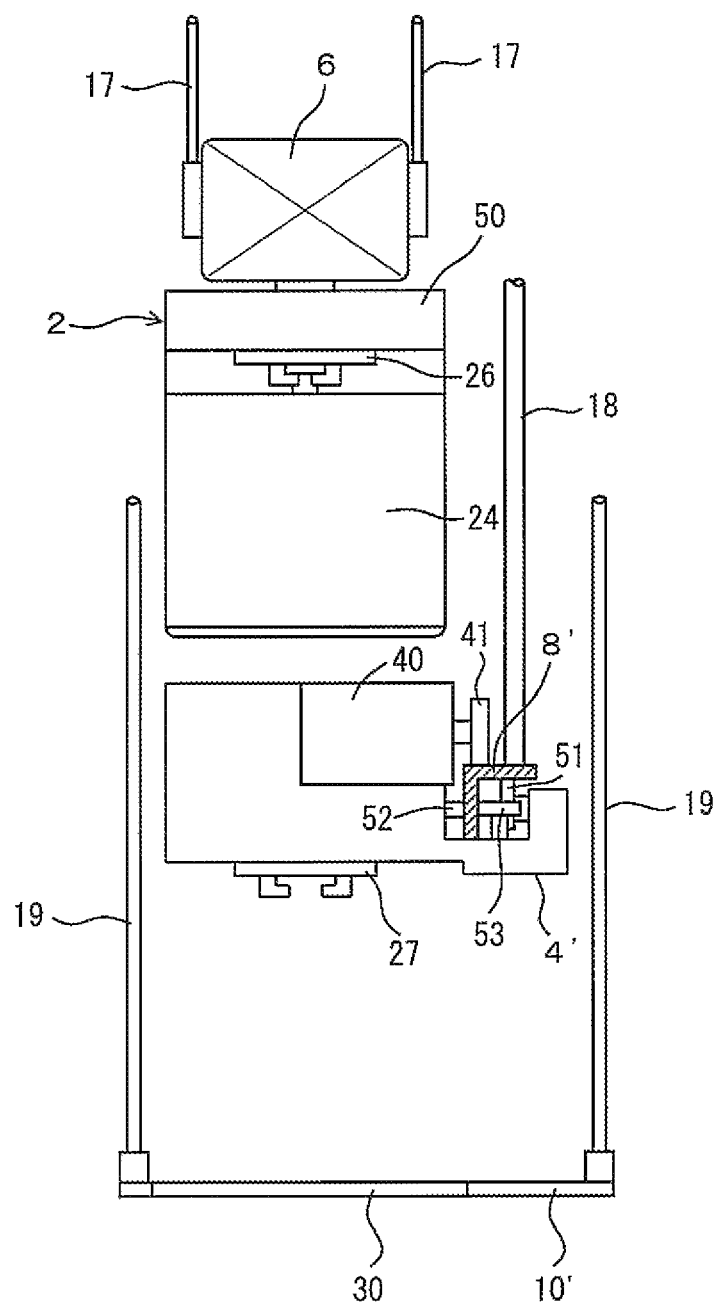
FIG. 6 is a plan view of relevant portions of a variation in which a local vehicle travels on a monorail.

FIG. 6 shows a transport system according to a variation of a preferred embodiment of the present invention, and in this figure, the same reference numerals denote portions that are the same as those in FIGS. 1 to 5, and the overhead travelling vehicle 2 is shown without the safety covers 25. In this variation, a local vehicle track 8' is preferably a monorail, for example. Although the cross-sectional shape of the track 8' is preferably L-shaped, for example, an arbitrary shape may be used. A local vehicle 4' preferably includes three types of guide rollers 51 to 53, for example, and the orientation of the local vehicle 4' is maintained due to the guide rollers 51 to 53 being guided by the track 8'. The guide roller 53 need not be provided. Reference numeral 10' denotes a new buffer, in which the gaps 30 are provided, and the articles 24 vertically pass through the gaps 30. In the variation shown in FIG. 6, the orientation of the local vehicle 4' readily becomes unstable since the local vehicle 4' is supported by a monorail.

The following describes control of the overhead travelling vehicle 2 and the local vehicle 4 of the present preferred embodiment. The overhead travelling vehicle 2 is controlled by a host controller (not shown), and the local controller 22 performs communication with the host controller, the overhead travelling vehicle 2, and the local vehicle 4. When the overhead travelling vehicle 14 and the local vehicle 4 deliver articles 24 to and receive articles 24 from the loading port 14, interlocking is performed using the optical communication units 31, 31', and 47. When the local vehicle 4 is positioned over the loading port 14, the overhead travelling vehicle 2 cannot perform optical communication, and interlocking is not established, and thus the delivery and receipt of articles is delayed until the local vehicle 4 moves to another position. When articles 24 are to be delivered and received between the buffer 10 or 11 and the overhead travelling vehicle 2, or the like, interlocking is established through communication between the overhead travelling vehicle 2 and the local controller 22. Also, in accordance with an instruction from the local controller 22, the local vehicle 4 performs the delivery and receipt of articles 24 with the buffer 10 or the like, and interlocking before delivery/receipt is not performed.

Inventory data indicating at which positions which articles are placed on the buffer 10 or the like is obtained through the above communication, and such inventory data is stored in the local controller 22. The local controller 22 manages the articles 24 on the buffer 10 or the like. Also, interlocking with the loading port 14 is established through direct communication with the overhead travelling vehicle 2 and the local vehicle, or through communication via the local controller 22.

Figure 7:
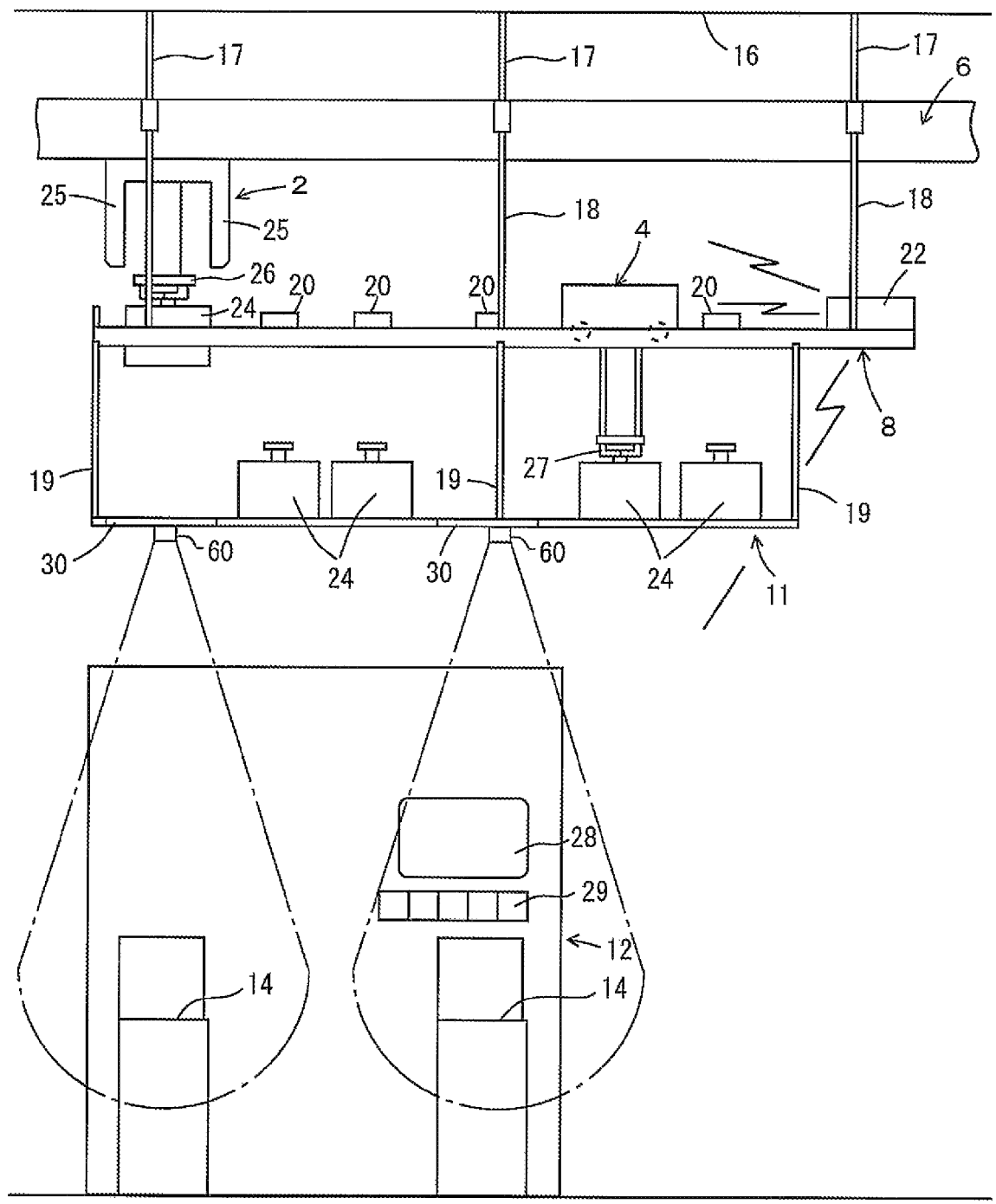
FIG. 7 is a side view of relevant portions of a transport system according to another preferred embodiment of the present invention.

FIG. 7 shows another preferred embodiment of the present invention, and in this figure, the same reference numerals denote portions that are the same as those in FIGS. 1 to 6. The preferred embodiment shown in FIG. 7 is similar to the variation shown in FIG. 2, with the exception of the points mentioned in particular below. Reference numeral 60 denotes a look-down sensor that emits a laser beam and detects the laser beam with use of a photoreception element when the laser beam has been reflected by an interfering object such as a person. An interfering object inside the monitoring range indicated by a chain line in the vicinity of the loading port 14 is detected by, for example, scanning the laser beam through changing its orientation, and using a phase difference between reflected light and the laser beam. A signal from the look-down sensor 60 is transmitted from the local controller 22 to the local vehicle 4 and the overhead travelling vehicle 2, and pick-up and drop-off from and to the loading port 14 is prohibited when an interfering object is present. Note that the type of sensor used to detect an interfering object is arbitrary.

The charging device 20 is provided, for example, at each stop position of the local vehicle 4 along the track 8, and the battery of the local vehicle 4 can be charged at an arbitrary one of such positions when the local vehicle 4 stops. Note that since it is not preferable for a standby position of the local vehicle 4 to be located over a loading port 14, a configuration is possible in which the charging devices 20 are not provided over the loading ports 14. Also, instead of a battery such as a lithium ion battery, it is possible to use a capacitor such as an electric double layer capacitor, for example.

The local controller 22 communicates with the overhead travelling vehicle 2 via optical or radio communication, and communicates with the local vehicle 4 and the processing devices 12 via optical, radio, or wired communication. Accordingly, interlocking can be established via the local controller 22 when the overhead travelling vehicle 2 and the local vehicle 4 are to move articles 24 to and from the buffer 11 and the loading ports 14.

The following describes an example of the operation of the transport system shown in FIG. 7.

The overhead travelling vehicle 2 drops off an article 24 onto the buffer 11, and removes an article 24 from the loading port 14. The provision of the buffer 11 enables reducing the occurrence of the problem of the overhead travelling vehicle 2 not being able to drop off an article 24, and allows the processing device 12 to keep a stock of articles 24 to be processed next on the buffer 11.

The local vehicle 4 delivers an article 24 from the buffer 11 to the loading port 14.

If there is the risk of an overflow of articles 24 at the loading port 14, the local vehicle 4 removes articles 24 and delivers them to the buffer 11.

An urgent article may be directly dropped off at the loading port 14 by the overhead travelling vehicle 2.

The standby position of the local vehicle 4 is a position that is not over a loading port 14, and further is above an article that is next in sequence to be dropped off at the loading port 14. This enables swift delivery of articles to the loading port 14.

The local vehicle 4 is charged at an arbitrary position while stopped. This enables driving of the local vehicle 4 with a low-capacity battery.

The local vehicle 4 picks up an article to be delivered to the loading port 14 at the same time as the overhead travelling vehicle 2 removes an article from the loading port 14. This enables swift delivery of the next article to the loading port 14.

If an article is to be delivered to the loading port 14, the overhead travelling vehicle 2 that is transporting the article to be delivered to the loading port 14 drops off the article at the buffer 11 that is upstream of the loading port 14, and subsequently the same overhead travelling vehicle 2 removes an article from the loading port 14. This enables efficient transport of the articles.

The above preferred embodiment achieves at least the following advantages.

The buffer 10 and the like can be provided without blocking the front surface of the processing devices 12.

The tracks 6 and 8 are disposed so as to overlap each other in the vertical direction, and the articles 24 can pass through the gap provided in the track 8, thus eliminating the need for a transverse feeding mechanism in the overhead travelling vehicle 2 and the local vehicle 4.

A buffer 10 or 11 having a sufficient capacity for the processing devices 12 can be provided by lengthening the track 8.

The overhead travelling vehicle 2 and the local vehicle 4 can both perform the delivery and receipt of articles with the loading ports 14 and the buffer 10 or 11 in both directions. This enables efficiently supplying of articles 24 to and removing of articles 24 from the loading ports 14 and the buffer 10 or 11.

Note that it is not necessary to provide all of the processing devices 12 with the system made up of the buffer 10, the local vehicle 4, and the track 8 for the local vehicle 4, and it is possible to provide such a system to only process devices 12 that process a large number of articles 24. The type of transport article is arbitrary, and examples thereof include a cassette accommodating a semiconductor exposure reticle, and a flat panel display substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transport system to transport an article among a plurality of processing devices, the transport system comprising:
   a first track that passes over loading ports of the processing devices;
   an overhead travelling vehicle travelling along the first track and including a hoist;
   a second track under and in parallel or substantially in parallel with the first track, the second track passing over the loading port;
   a buffer for placement of the article, the buffer being provided under the second track at a position higher than the loading port, and being arranged to allow the article to pass in a vertical direction over the loading port; and
   a local vehicle travelling along the second track and including a hoist to perform delivery and receipt of the article between the buffer and the loading port.

2. The transport system according to claim 1, wherein the second track includes at least a pair of rails, and a gap through which the article passes in the vertical direction is provided between the pair of rails.

3. The transport system according to claim 1, wherein the first track, the second track, and the buffer are disposed in front of the processing device so as to overlap with each other in parallel or substantially in parallel in plan view, the buffer is provided with a gap over the loading port, and the overhead travelling vehicle and the local vehicle perform delivery and receipt of the article with the loading port via the gap in the buffer.

4. The transport system according to claim 1, wherein the buffer is disposed at a height which enables the local vehicle to pass over the buffer on which the article is placed in a case where the local vehicle is transporting the article.

5. The transport system according to claim 1, wherein the buffer is disposed at a height which enables the local vehicle to pass over the buffer on which the article is placed in a case where the local vehicle is not transporting the article, and the local vehicle cannot pass over the buffer on which the article is placed in a case where the local vehicle is transporting the article.

6. The transport system according to claim 1, wherein the buffer includes a look-down sensor to detect an interfering object on a side of the loading port.

7. The transport system according to claim 1, further comprising:
   a controller arranged and programmed to control the overhead travelling vehicle and the local vehicle such that the overhead travelling vehicle delivers the article to the buffer and removes the article from the loading port, and the local vehicle delivers the article from the buffer to the loading port.

8. The transport system according to claim 1, wherein the local vehicle is battery-driven, and a charging device to charge a power storage member in the local vehicle is provided at a position along the second track that is located away from a position over the loading port and away from a position over the buffer.

9. The transport system according to claim 1, wherein the local vehicle is driven by electrical power from a power storage member, and a charging device to charge the power storage member in the local vehicle is provided at each stop position of the local vehicle along the second track.

10. The transport system according to claim 1, wherein the overhead travelling vehicle comprises an optical communication member that is at a position over the loading port and is arranged to perform optical communication with the loading port by light that has a vertically-oriented optical axis and passes through a travelling path of the local vehicle.

11. The transport system according to claim 1, wherein a controller of the local vehicle is arranged to communicate with the overhead travelling vehicle, the local vehicle, and the processing device.

12. A transport system for addition on to an existing overhead travelling vehicle system including an overhead travelling vehicle in which a hoist is included and an overhead travelling vehicle track that passes over a loading port of a processing device, the transport system comprising:
- a second track that is under the overhead travelling vehicle track, passes over the loading port of the processing device, and is disposed in parallel or substantially in parallel with the overhead travelling vehicle track;
- a buffer for placement of an article, the buffer being provided under the second track at a position higher than the loading port, and being arranged such that the article is capable of passing in a vertical direction over the loading port; and
- a local vehicle that travels along the second track and includes a hoist to perform delivery and receipt of the article between the buffer and the loading port.

13. A transport method for performing delivery and receipt of an article between an overhead travelling vehicle in which a hoist is provided and a loading port of a processing device, the overhead travelling vehicle travelling along an overhead travelling vehicle track that passes over the loading port of the processing device, wherein a second track is under the overhead travelling vehicle track, passes over the loading port of the processing device, and is disposed in parallel or substantially in parallel with the overhead travelling vehicle track, a buffer for placement of the article is under the second track at a position higher than the loading port and arranged to allow the article to pass in a vertical direction over the loading port, and a local vehicle travels along the second track and includes a hoist to perform delivery and receipt of the article between the buffer and the loading port, the method comprising:
- a step for performing delivery and receipt of the article with the buffer using the hoist by the overhead travelling vehicle; and
- a step for performing delivery and receipt of the article between the buffer and the loading port by the local vehicle.

* * * * *